US012782409B2

(12) United States Patent
Wu et al.

(10) Patent No.: US 12,782,409 B2
(45) Date of Patent: Nov. 3, 2026

(54) POE AND CABLE TESTER WITH BT STANDARD TEST

(71) Applicant: Shenzhen Noyafa Electronic Co., Ltd., Shenzhen (CN)

(72) Inventors: Haiyan Wu, Shenzhen (CN); Ming Lei, Shenzhen (CN); Jianping Zhang, Shenzhen (CN)

(73) Assignee: Shenzhen Noyafa Electronic Co., Ltd., Shenzhen (CN)

( * ) Notice: Subject to any disclaimer, the term of this patent is extended or adjusted under 35 U.S.C. 154(b) by 272 days.

(21) Appl. No.: 18/733,908

(22) Filed: Jun. 5, 2024

(65) Prior Publication Data

US 2025/0283929 A1 Sep. 11, 2025

(30) Foreign Application Priority Data

Mar. 8, 2024 (CN) ........................ 202420449764.8

(51) Int. Cl.
*G01R 31/08* (2020.01)
*H02H 3/04* (2006.01)
*H04L 12/10* (2006.01)
*H04L 43/50* (2022.01)

(52) U.S. Cl.
CPC ............. *G01R 31/08* (2013.01); *H02H 3/048* (2013.01); *H04L 12/10* (2013.01); *H04L 43/50* (2013.01)

(58) Field of Classification Search
CPC ........ G01R 31/08; G01R 31/40; G01R 31/58; H02H 3/048; H04L 12/10; H04L 43/50
USPC ........................................................ 324/76.11
See application file for complete search history.

(56) References Cited

U.S. PATENT DOCUMENTS 7,509,114 B2 * 3/2009 Berson .................. H04M 19/08 455/127.1
10,057,073 B2 * 8/2018 Ferentz ..................... G05F 3/16
2007/0263333 A1 * 11/2007 Apfel ..................... H02H 9/041 361/91.1
2016/0197734 A1 * 7/2016 Darshan .................. H04L 12/10 307/1
2018/0062386 A1 * 3/2018 Mallikarjunaswamy ................... H02H 9/046
2019/0331741 A1 * 10/2019 Hittel ..................... G01R 31/40

* cited by examiner

*Primary Examiner* — Roberto Velez

(57) ABSTRACT

A new POE & cable tester with BT standard test, including an interface module, a network transformer, a rectifier module, a power management module, and at least one optocoupler detection module, in which the interface module is connected to a primary coil, a secondary coil output end of the network transformer is connected to a line testing module, a center tap of the network transformer is connected to the rectifier module, the power management module is connected to an output end of the rectifier module, the power management module is connected to at least one optocoupler detection module, and the optocoupler detection module is connected to a data end of a central control module. The present disclosure is introduced based on the market demand for testing IEEE 802.3bt standard POE switch, which allows testing IEEE 802.3bt standard POE switch standard, and allows screening of POE switch standard with RJ45/RJ11 connector.

7 Claims, 6 Drawing Sheets

POE AND CABLE TESTER WITH BT STANDARD TEST

CROSS REFERENCE TO RELATED APPLICATIONS

The present application claims the benefit of Chinese Patent Application No. 2024204497648 filed on Mar. 8, 2024, the contents of which are incorporated herein by reference in their entirety.

FIELD

The present disclosure relates to a cable tester and, particularly, a new POE & cable tester with BT standard test.

BACKGROUND

POE (Power over Ethernet) is a technology that allows power and data signals to be transmitted to remote devices over an Ethernet network without additional power cables, and the technology is widely used in many applications, especially in devices such as webcams, IP phones, and wireless access points.

IEEE 802.3af and IEEE 802.3at are two POE-related standards that define specifications for transmitting power over Ethernet cables. These standards enable devices to transmit both data and power over a single Ethernet connection, providing easier installation and maintenance for devices such as IP phones, webcams, and wireless access points. IEEE 802.3af, released in 2003, the very first POE, has a maximum power of 15.4 W, a voltage range of 37-57V, and an operating mode that uses one of the two pairs of Ethernet cables for power transmission. The IEEE 802.3af standard enables up to 15.4 W of power to be supplied to the device and defines a communication protocol between the PSE (Power Sourcing Equipment) and the PD (Powered Device) in order to negotiate the power requirements when connecting.

IEEE 802.3at, released in 2009 and also known as POE+, has a maximum power of 30 W, a voltage range of 42.5-57V, and an operating mode that uses all four pairs of Ethernet cables simultaneously for power transmission. IEEE 802.3at enhances the requirements for power transmission by providing up to 30 W. It supports power transmission using the wires in all four pairs of Ethernet cables, improving the efficiency and reliability of power transmission.

The introduction of these two standards enables a variety of devices to be supplied with power more flexibly over Ethernet connections, which is important for reducing deployment and maintenance costs, especially in scenarios where power needs to be transmitted over long distances, and it facilitates the wider use of POE technology.

IEEE 802.3bt is a standard related to POE, which is a further development of IEEE 802.3af and IEEE 802.3at, providing the ability to transmit power at higher power levels. Often referred to as POE++, this standard allows higher power to be transmitted over Ethernet cables to meet the requirements of devices with higher power needs. IEEE 802.3bt, released in 2018, has a maximum power of up to 71 W or more, specifically depending on the type of device and its needs, and the 802.3bt standard specifies a wide range of voltage to accommodate the power needs of different devices. Similar to the 802.3at standard, 802.3bt uses the wires in all four pairs of Ethernet cables for power transmission to improve efficiency and reliability. The introduction of the IEEE 802.3bt standard enables POE technology to better meet the needs of devices with high power requirements, such as some high-performance cameras, wireless access points, and electric vehicle charging piles, which further promotes the widespread use of POE technology in various fields.

A cable tester is a device used to test the performance and quality of cables, which is commonly used in networking, communications, power, and other fields that require the use of cables to transmit signals or power. Cable testers detect and diagnose a variety of problems in cables, such as resistance, inductance, capacity, short-circuits, and break-circuits, to ensure the stability and reliability of the cable network. At present, the cable tester with POE test standard sold on the market is commonly only to test the IEEE 802.3af/at standard, and unable to test the POE switch with IEEE 802.3bt standard.

SUMMARY

In view of the aforementioned deficiencies that the cable tester of the prior art is unable to test the POE switch with IEEE 802.3bt standard, provided in the present disclosure is a new POE & cable tester with BT standard test, which adopts a power management module together with an optocoupler detection module in a circuit structure, which solves the aforementioned problems.

The technical solutions adopted by the present disclosure to solve the technical problems are as follows. A new POE & cable tester with BT standard test includes an interface module, a network transformer U1, a rectifier module, a power management module, and at least one optocoupler detection module, wherein the interface module is connected to a primary coil, a secondary coil output end of the network transformer U1 is connected to a line testing module, a center tap of the network transformer U1 is connected to the rectifier module, the power management module is connected to an output end of the rectifier module, the power management module is connected to at least one optocoupler detection module respectively, and the optocoupler detection module is connected to a data end of a central control module.

The technical solutions adopted by the present disclosure to solve the technical problems further include:

The center tap of the network transformer U1 is connected with a filter module, the filter module adopts series-connected RC filters, each center tap is connected with a set of filter module, each set of filter module includes a resistor and a capacitor, an end of the resistor is connected to one center tap of the network transformer U1, an opposite end of the resistor is connected to an end of the capacitor, an opposite end of the capacitor is grounded, and the rectifier module is connected to a connection end between the resistor and the center tap of the network transformer U1.

The rectifier module adopts a bridge rectifier D6 and a bridge rectifier D7, a positive output end of the bridge rectifier D6 is connected to a positive output end of the bridge rectifier D7, and a negative output end of the bridge rectifier D6 is connected to a negative output end of the bridge rectifier D7.

An output end of the rectifier module is connected with an over-voltage protection module, and the over-voltage protection module adopts a TVS tube D8.

The power management module adopts a PoE-PD interface controller U11, a VPN interface of the PoE-PD interface controller U11 is connected to a negative output end of the rectifier module, an ASC interface of the PoE-PD interface controller U11 is connected to the negative output end of the rectifier module via a resistor R28, a CLA interface of the PoE-PD interface controller U11 is connected to the negative output end of the rectifier module via a resistor R48, a CLB interface of the PoE-PD interface controller U11 is connected to the negative output end of the rectifier module via a resistor R49, a COSC interface of the PoE-PD interface controller U11 is connected to an end of a capacitor C16, the end of the capacitor C16 is connected to a DET interface of the PoE-PD interface controller U11 via a resistor R47, an opposite end of the capacitor C16 is connected to the negative output end of the rectifier module, an AUX interface of the PoE-PD interface controller U11 is connected to the negative output end of the rectifier module via a resistor R34, a capacitor C1 is connected in parallel to the resistor R34, an RTN interface and an EP interface of the PoE-PD interface controller U11 are grounded, a GBR interface of the PoE-PD interface controller U11 is connected to a positive output end of the rectifier module via a resistor R29, and a PGO interface, an NCL interface, an NCM interface, an LCF interface of the PoE-PD interface controller U11 are each connected to one set of the optocoupler detection module.

Provided are four sets of the optocoupler detection module. A first set of the optocoupler detection module includes a current limiting resistor R24, an MOS tube Q5, a resistor R74, an optocoupler U3, a resistor R75, a resistor R76, and a resistor R33, a PGO interface of the PoE-PD interface controller U11 is connected to a positive output end of the rectifier module via the resistor R24, a gate of the MOS tube Q5 is connected to the PGO interface of the PoE-PD interface controller U11, a source of the MOS tube Q5 is grounded, a drain of the MOS tube Q5 is connected to the positive output end of the rectifier module via a light-emitting diode of the optocoupler U3, the resistor R76, and the resistor R75 sequentially connected in series, the drain of the MOS tube Q5 is connected to the positive output end of the rectifier module via the resistor R74, an emitter of a photosensitive triode of the optocoupler U3 is grounded, and a collector of the photosensitive triode of the optocoupler U3 is connected to a common I/O port of the central control module.

A second set of the optocoupler detection module includes an optocoupler U4, a resistor R18, a resistor R19, and a resistor R32, an NCL interface of the PoE-PD interface controller U11 is connected to the positive output end of the rectifier module via a light-emitting diode of the optocoupler U4, the resistor R19, the resistor R18 sequentially connected in series, an emitter of a photosensitive triode of the optocoupler U4 is grounded, a collector of the photosensitive triode of the optocoupler U4 is connected to a 3.3V power supply via the resistor R32, and the collector of the photosensitive triode of the optocoupler U4 is connected to a common I/O port of the central control module.

A third set of the optocoupler detection module includes an optocoupler U7, a resistor R21, a resistor R20, and a resistor R35, an NCM interface of the PoE-PD interface controller U11 is connected to the positive output end of the rectifier module via a light-emitting diode of the optocoupler U7, the resistor R21, and the resistor R20 sequentially connected in series, an emitter of a photosensitive triode of the optocoupler U7 is grounded, a collector of the photosensitive triode of the optocoupler U7 is connected to a 3.3V power supply via the resistor R35, and the collector of the photosensitive triode of the optocoupler U7 is connected to a common I/O port of the central control module.

A fourth set of optocoupler detection module includes an optocoupler U8, a resistor R23, a resistor R22, and a resistor R38, an LCF interface of the PoE-PD interface controller U11 is connected to the positive output end of the rectifier module via a light-emitting diode of the optocoupler U8, the resistor R23, and the resistor R22 sequentially connected in series, an emitter of a photosensitive triode of the optocoupler U8 is grounded, a collector of the photosensitive triode of the optocoupler U8 is connected to a 3.3V power supply via the resistor R38, and the collector of the photosensitive triode of the optocoupler U8 is connected to a common I/O port of the central control module.

A filter capacitor C22 is connected between the positive output end of the rectifier module and the ground.

A TVS tube D9 is connected between a gate of the MOS tube Q5 and ground.

The beneficial effects of the present disclosure are as follows. The present disclosure is introduced based on the market demand for testing IEEE 802.3bt standard POE switch, which allows testing IEEE 802.3bt standard POE switch standard, and allows the screening of POE switch standard with RJ45/RJ11 connector.

The present disclosure is further described below in conjunction with the attached drawings and the specific implementations.

DETAILED DESCRIPTION OF THE EMBODIMENTS

The present embodiment is a preferred embodiment of the present disclosure, and any other principle and basic structure that is the same or similar to the present embodiment falls within the scope of protection of the present disclosure.

Figure 1:
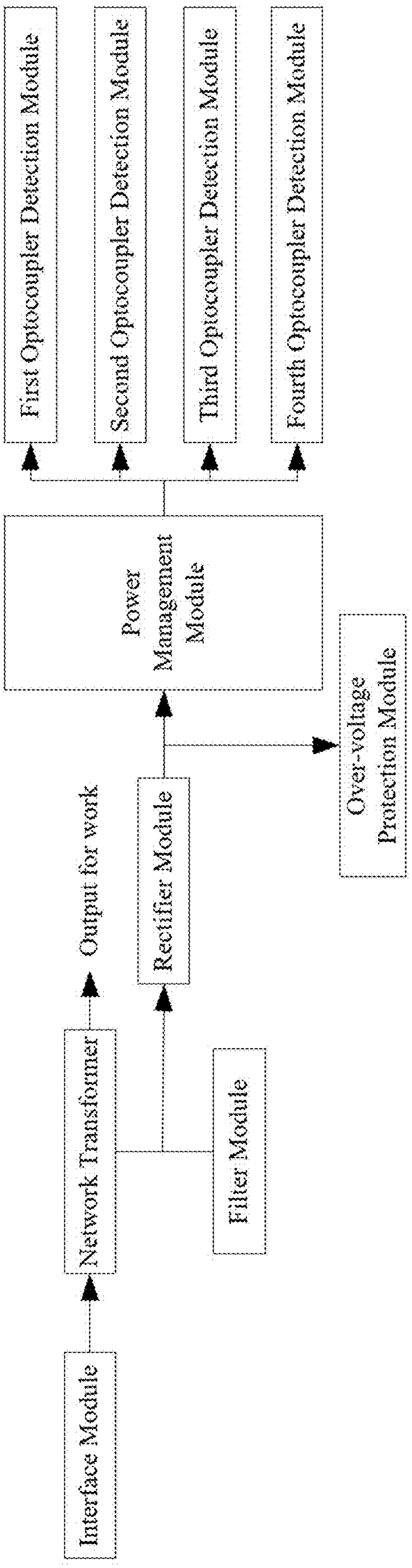
FIG. 1 is a circuit block diagram of the present disclosure.
Figure 2:
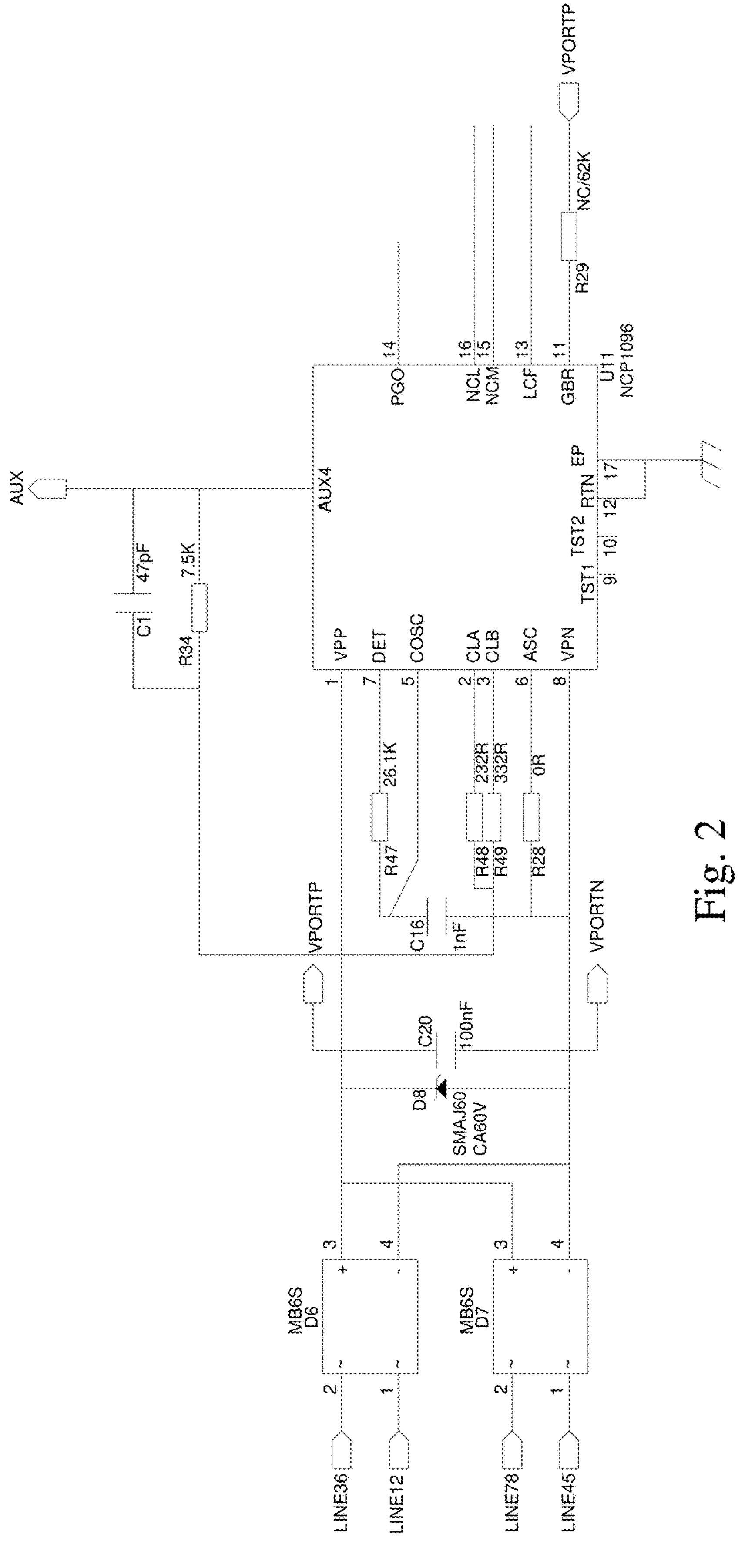
FIG. 2 is a circuit diagram of the power management module part of the present disclosure.
Figure 3:
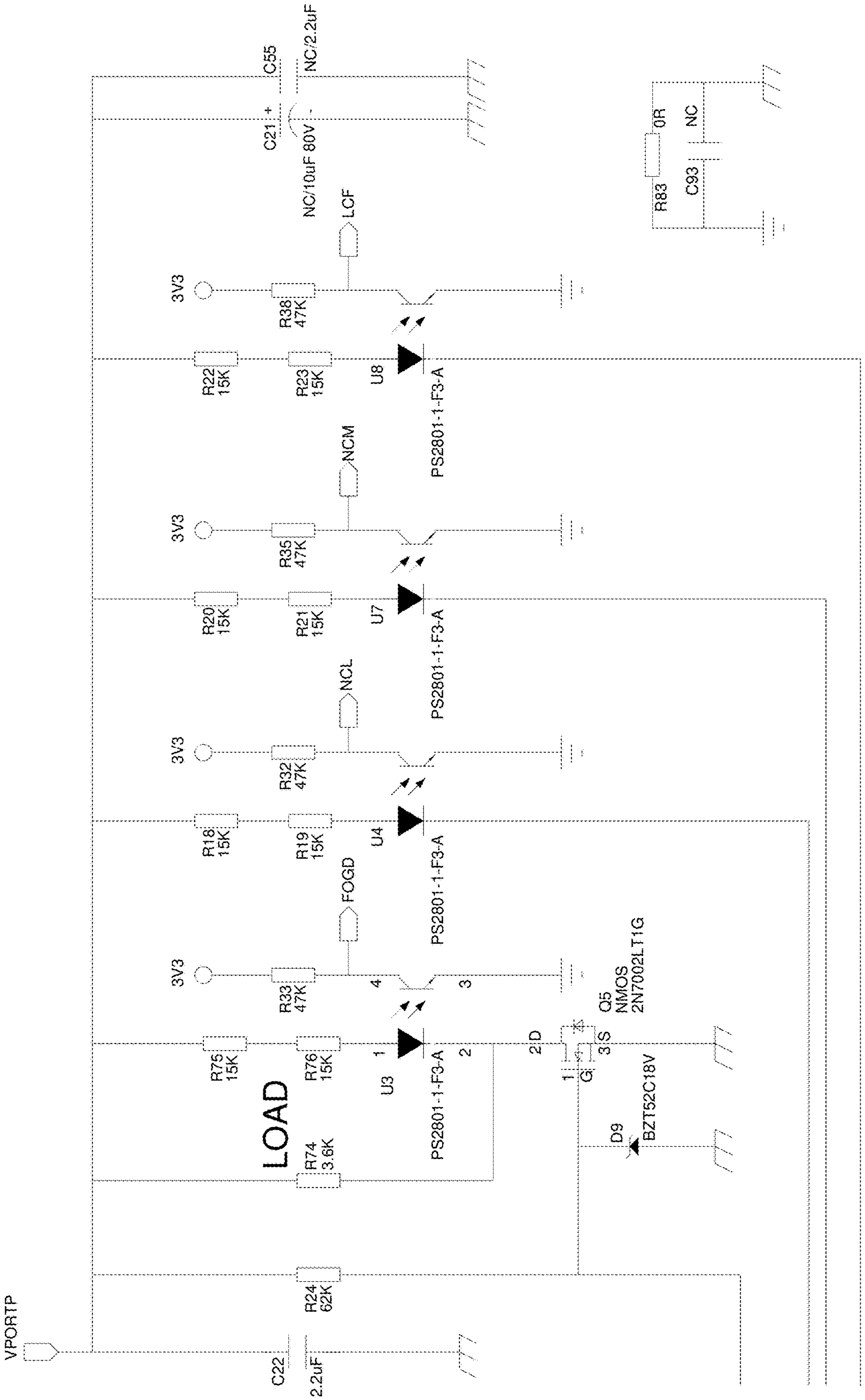
FIG. 3 is a circuit diagram of the optocoupler detection module part of the present disclosure.
Figure 4:
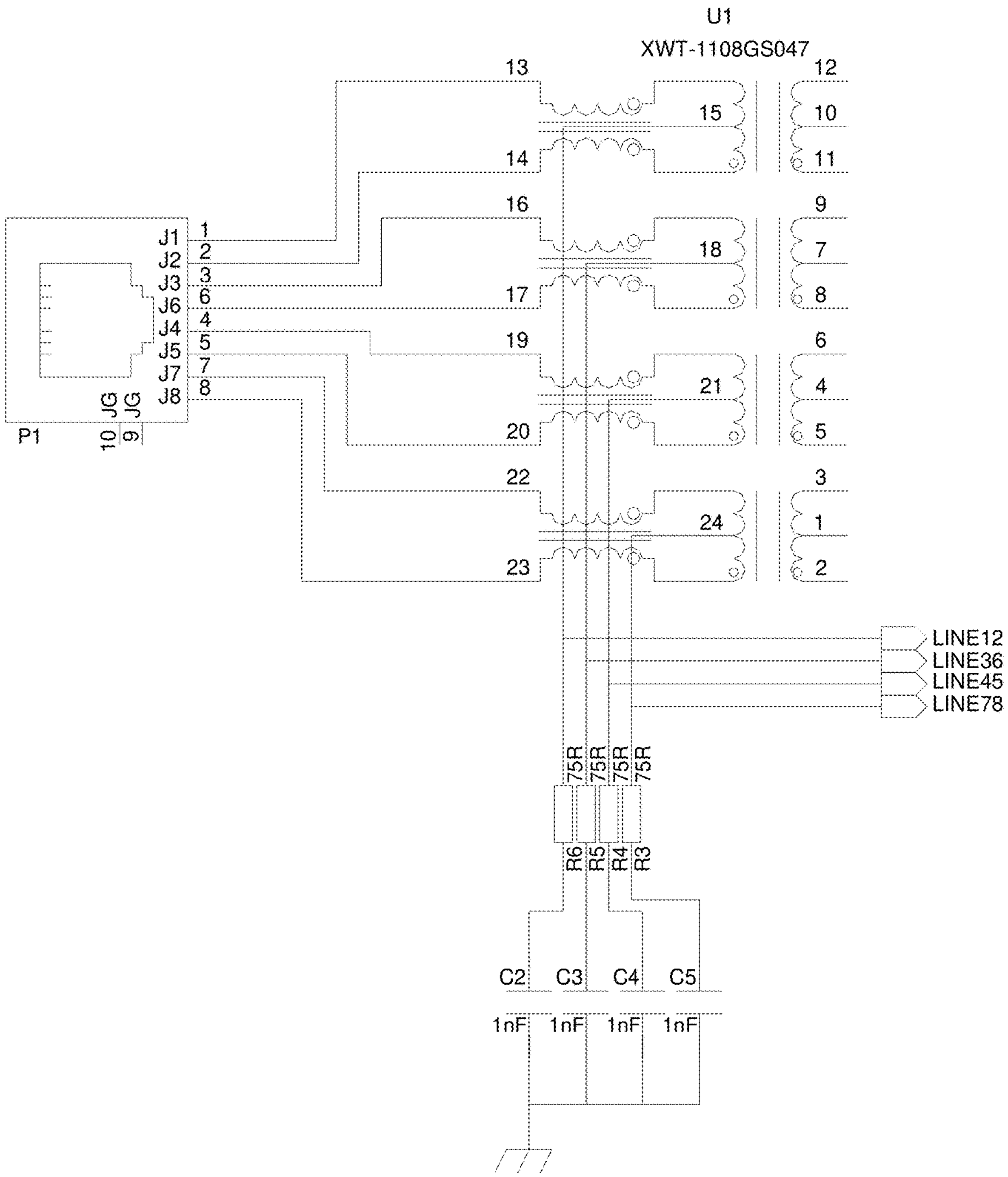
FIG. 4 is a circuit diagram of the interface module part of the present disclosure.
Figure 5:
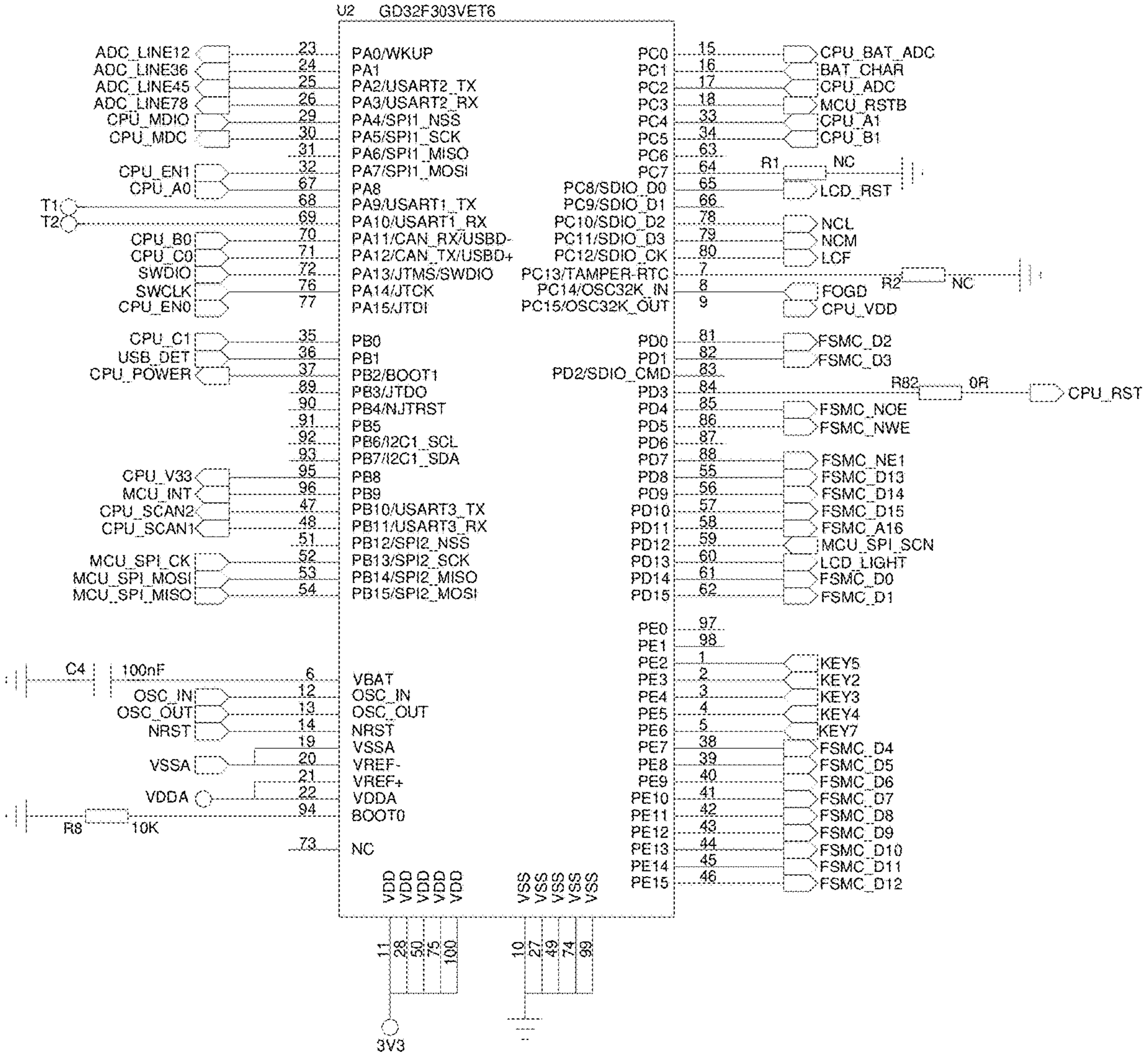
FIG. 5 is a circuit diagram of the central control module part of the present disclosure.
Figure 6:
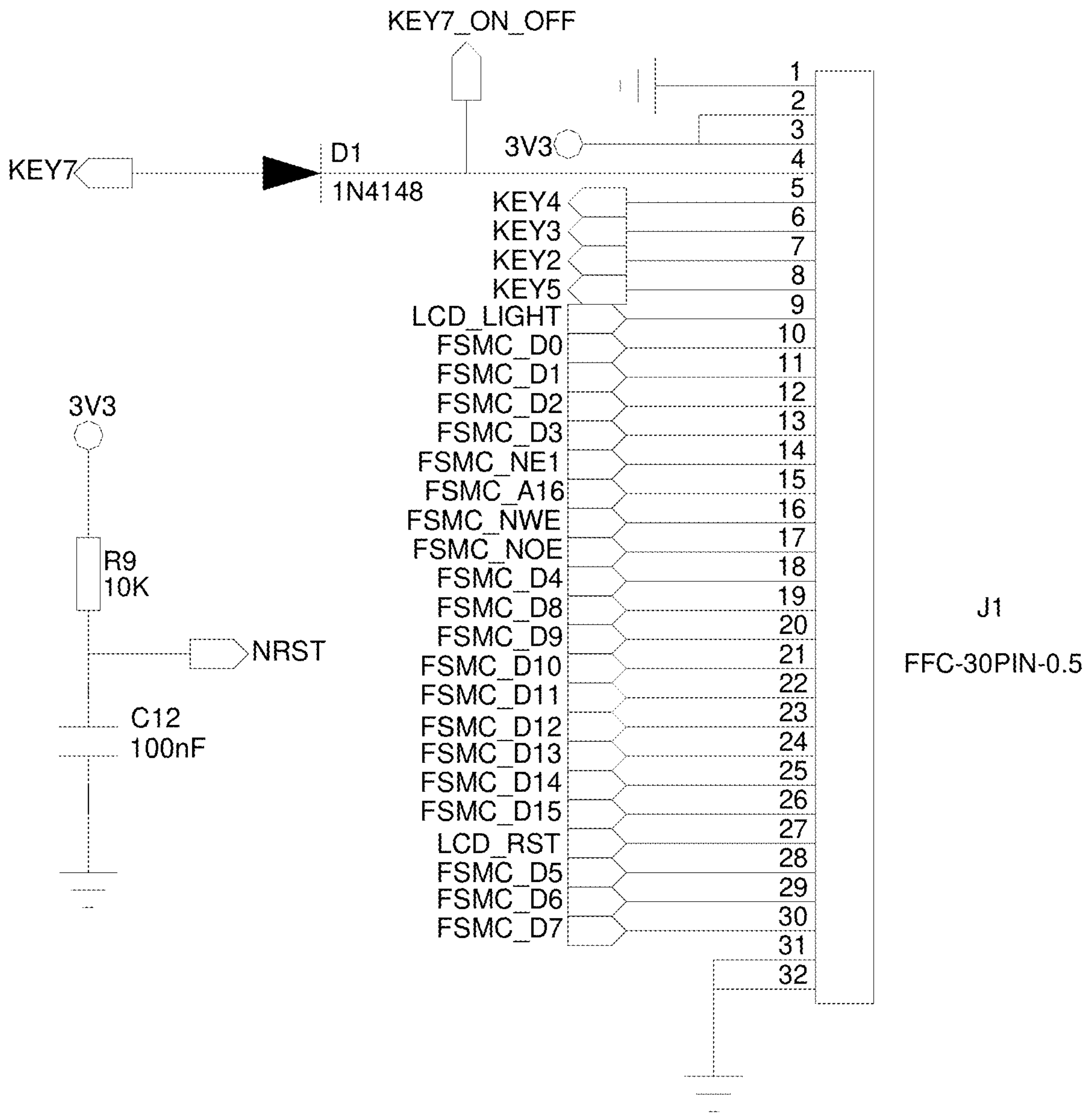
FIG. 6 is a circuit diagram of the display interface part of the present disclosure.

Referring to FIGS. 1-6, protected in the present disclosure is a new POE & cable tester with BT standard test, mainly including an interface module, a network transformer U1, a rectifier module, a power management module, and at least one optocoupler detection module, wherein the interface module is connected to a primary coil, a secondary coil output end of the network transformer U1 is connected to a line testing module, a center tap of the network transformer U1 is connected to the rectifier module, the power management module is connected to an output end of the rectifier module, the power management module is connected to at least one optocoupler detection module respectively, and the optocoupler detection module is connected to a data end of a central control module.

In the present embodiment, the line testing module may adopt end flashing, length measurement, voltage measurement or other modules for detecting cable functions. The focus of the present disclosure is to adopt the primary coil to complete the detection of BT, and the line testing module may adopt the conventional cable detection module in the prior art.

In the present embodiment, the central control module adopts the microcontroller chip U2 of model GD32F303VET6, and may be replaced by other models of microcontroller chips in specific implementations, which is only required to satisfy that the outputs of 4 optocoupler detection modules may be simultaneously detected to determine the standard of POE. The central control module requires at least four ordinary I/O ports to complete it, while other peripheral circuits are designed according to other line testing functions.

In the present embodiment, the interface module adopts an RJ-45 interface P1, which may also be replaced with other interfaces according to the actual situation in the specific implementation.

In the present embodiment, the network transformer U1 is a network transformer of model XWT-1108GS047, which may be replaced by other models of network transformers with the same function in specific implementations.

In the present embodiment, the center tap of the network transformer U1 is connected with a filter module, the filter module adopts series-connected RC filters. Since an RJ-45 interface is adopted in the present embodiment, the network transformer U1 has four center taps, and each center tap is connected with a set of filter module. Taking the first set as an example to illustrate the circuit structure, the other filter modules have the same circuit structure as the first group. The first set of filter module includes a resistor R6 and a capacitor C2, an end of the resistor R6 is connected to a first center tap of the network transformer U1, an opposite end of the resistor R6 is connected to an end of the capacitor C2, an opposite end of the capacitor C2 is grounded, and the rectifier module is connected to a connection end between the resistor R6 and the center tap of the network transformer U1.

In the present embodiment, the rectifier module adopts a bridge rectifier D6 and a bridge rectifier D7. The bridge rectifier D6 and the bridge rectifier D7 both adopt the bridge rectifier chip with the model number MB6S, and may be replaced by other models of network transformers with the same function in specific implementations. A positive output end of the bridge rectifier D6 is connected to a positive output end of the bridge rectifier D7, and a negative output end of the bridge rectifier D6 is connected to a negative output end of the bridge rectifier D7.

In the present embodiment, an output end of the rectifier module is connected with an over-voltage protection module. The over-voltage protection module adopts a TVS tube D8 of model SMAJ60CA60, and may be replaced by other models or other types of over-voltage protection modules in specific implementations.

In the present embodiment, the positive output end (i.e., the VPORTP end) of the rectifier module is connected to each optocoupler detection module.

In the present embodiment, the positive output end (i.e., the VPORTP end) of the rectifier module is connected to the GBR interface of the power management module.

In the present embodiment, the power management module adopts the PoE-PD interface controller U11 of model NCP1096, and may be replaced by other models of chips with the same function in specific implementations. A VPN interface of the PoE-PD interface controller U11 is connected to a negative output end of the rectifier module, an ASC interface of the PoE-PD interface controller U11 is connected to the negative output end of the rectifier module via a resistor R28, a CLA interface of the PoE-PD interface controller U11 is connected to the negative output end of the rectifier module via a resistor R48, a CLB interface of the PoE-PD interface controller U11 is connected to the negative output end of the rectifier module via a resistor R49, a COSC interface of the PoE-PD interface controller U11 is connected to an end of a capacitor C16, the end of the capacitor C16 is connected to a DET interface of the PoE-PD interface controller U11 via a resistor R47, an opposite end of the capacitor C16 is connected to the negative output end of the rectifier module, an AUX interface of the PoE-PD interface controller U11 is connected to the negative output end of the rectifier module via a resistor R34, a capacitor C1 is connected in parallel to the resistor R34, an RTN interface and an EP interface of the PoE-PD interface controller U11 are grounded, a GBR interface of the PoE-PD interface controller U11 is connected to a positive output end (i.e., the VPORTP end) of the rectifier module via a resistor R29, and a PGO interface, an NCL interface, an NCM interface, an LCF interface of the PoE-PD interface controller U11 are each connected to one set of the optocoupler detection module.

In the present embodiment, provided are four sets of the optocoupler detection module; a first set of the optocoupler detection module includes a current limiting resistor R24, an MOS tube Q5, a resistor R74, an optocoupler U3, a resistor R75, a resistor R76, and a resistor R33, a PGO interface of the PoE-PD interface controller U11 is connected to a positive output end of the rectifier module via the resistor R24, a gate of the MOS tube Q5 is connected to the PGO interface of the PoE-PD interface controller U11, a source of the MOS tube Q5 is grounded, a drain of the MOS tube Q5 is connected to the positive output end of the rectifier module via a light-emitting diode of the optocoupler U3, the resistor R76, and the resistor R75 sequentially connected in series, the drain of the MOS tube Q5 is connected to the positive output end of the rectifier module via the resistor R74, an emitter of a photosensitive triode of the optocoupler U3 is grounded, and a collector of the photosensitive triode of the optocoupler U3 is connected to a common I/O port of the central control module.

In the present embodiment, a filter capacitor C22 is connected between the positive output end of the rectifier module and ground.

In the present embodiment, a TVS tube D9 is connected between a gate of the MOS tube Q5 and ground.

In the present embodiment, a second set of the optocoupler detection module includes an optocoupler U4, a resistor R18, a resistor R19, and a resistor R32, an NCL interface of the PoE-PD interface controller U11 is connected to the positive output end of the rectifier module via a light-emitting diode of the optocoupler U4, the resistor R19, the resistor R18 sequentially connected in series, an emitter of a photosensitive triode of the optocoupler U4 is grounded, a collector of the photosensitive triode of the optocoupler U4 is connected to a 3.3V power supply via the resistor R32, and the collector of the photosensitive triode of the optocoupler U4 is connected to a common I/O port of the central control module.

In the present embodiment, a third set of the optocoupler detection module includes an optocoupler U7, a resistor R21, a resistor R20, and a resistor R35, an NCM interface of the PoE-PD interface controller U11 is connected to the positive output end of the rectifier module via a light-emitting diode of the optocoupler U7, the resistor R21, and the resistor R20 sequentially connected in series, an emitter of a photosensitive triode of the optocoupler U7 is grounded, a collector of the photosensitive triode of the optocoupler U7 is connected to a 3.3V power supply via the resistor R35, and the collector of the photosensitive triode of the optocoupler U7 is connected to a common I/O port of the central control module.

In the present embodiment, a fourth set of optocoupler detection module includes an optocoupler U8, a resistor R23, a resistor R22, and a resistor R38, an LCF interface of the PoE-PD interface controller U11 is connected to the positive output end of the rectifier module via a light-emitting diode of the optocoupler U8, the resistor R23, and the resistor R22 sequentially connected in series, an emitter of a photosensitive triode of the optocoupler U8 is grounded, a collector of the photosensitive triode of the optocoupler U8 is connected to a 3.3V power supply via the resistor R38, and the collector of the photosensitive triode of the optocoupler U8 is connected to a common I/O port of the central control module.

The IEEE 802.3bt standard detection principle of the present disclosure is as follows: when the PSE device detects the PD device, it classifies the PD device, and responds to and completes the classification of all PSEs through the NCP1096 chip which has been set up with a power level. According to the power that the PSE device manages to provide to the PD, the NCP1096 labels the PSE and writes the result to the status output NCL NCM and LCF pins. The standard of the PSE device is judged by reading the electrical characteristics of the written status output NCL NCM and LCF pins.

When in use, the POE switch port is connected to the P1 port of the present disclosure via RJ45 terminal cable, and the NCP1096 chip is connected via rectifier, voltage regulator and filter, the NCP1096 chip performs the corresponding and marks the power that the switch manages to provide for the POE switch and writes the test results to the status output NCL NCM and LCF pins, which are isolated via optocoupler, and reads the electrical characteristics of the written status output NCL, NCM, and LCF pins to judge the standard of the PSE equipment.

The present disclosure is introduced based on the market demand for testing IEEE 802.3bt standard POE switch, which allows testing IEEE 802.3bt standard POE switch standard, and allows the screening of POE switch standard with RJ45/RJ11 connector.

The invention claimed is:

1. A new Power over Ethernet (POE) & cable tester with IEEE 802.3bt (BT) standard test, comprising an interface module, a network transformer (U1), a rectifier module, a power management module, and at least one optocoupler detection module, wherein the interface module is connected to a primary coil of the network transformer (U1), a secondary coil output end of the network transformer (U1) is connected to a line testing module, a center tap of the network transformer (U1) is connected to the rectifier module; wherein the center tap of the network transformer (U1) is connected with a filter module, the filter module adopts series-connected Resistor-Capacitor (RC) filters, each center tap is connected with a set of filter module, each set of filter modules comprises a resistor and a capacitor, an end of the resistor is connected to one center tap of the network transformer (U1), an opposite end of the resistor is connected to an end of the capacitor, an opposite end of the capacitor is grounded, and the rectifier module is connected to a connection end between the resistor and the center tap of the network transformer (U1), the power management module is connected to an output end of the rectifier module, the power management module is connected to the at least one optocoupler detection module respectively, and the optocoupler detection module is connected to a data end of a central control module.

2. The new POE & cable tester with BT standard test according to claim 1, wherein the rectifier module adopts a bridge rectifier (D6) and a bridge rectifier (D7), a positive output end of the bridge rectifier (D6) is connected to a positive output end of the bridge rectifier (D7), and a negative output end of the bridge rectifier (D6) is connected to a negative output end of the bridge rectifier (D7).

3. The new POE & cable tester with BT standard test according to claim 1, wherein an output end of the rectifier module is connected with an over-voltage protection module, and the over-voltage protection module adopts a Transient Voltage Suppression (TVS) tube (D8).

4. The new POE & cable tester with BT standard test according to claim 1, wherein the power management module adopts a Power over Ethernet Powered Device (PoE-PD) interface controller (U11), a Voltage Power Negative (VPN) interface of the PoE-PD interface controller (U11) is connected to a negative output end of the rectifier module, an Autoclass Support (ASC) interface of the PoE-PD interface controller (U11) is connected to the negative output end of the rectifier module via a resistor (R28), a Class A (CLA) interface of the PoE-PD interface controller (U11) is connected to the negative output end of the rectifier module via a resistor (R48), a Class B (CLB) interface of the PoE-PD interface controller (U11) is connected to the negative output end of the rectifier module via a resistor (R49), a Capacitor Oscilator (COSC) interface of the PoE-PD interface controller (U11) is connected to an end of a capacitor (C16), the end of the capacitor (C16) is connected to a Detection (DET) interface of the PoE-PD interface controller (U11) via a resistor (R47), an opposite end of the capacitor (C16) is connected to the negative output end of the rectifier module, an Auxiliary (AUX) interface of the PoE-PD interface controller (U11) is connected to the negative output end of the rectifier module via a resistor (R34), a capacitor (C1) is connected in parallel to the resistor (R34), a Return (RTN) interface and an Exposed Pad (EP) interface of the PoE-PD interface controller (U11) are grounded, a Gate Bridge Rectifier (GBR) interface of the PoE-PD interface controller (U11) is connected to a positive output end of the rectifier module via a resistor (R29), and a Power Good Output (PGO) interface, a Negative Class LSB (NCL) interface, a Negative Class MSB (NCM) interface, and a Long Classification Finger (LCF) interface of the PoE-PD interface controller (U11) are each connected to one set of the optocoupler detection module.

5. The new POE & cable tester with BT standard test according to claim 1, wherein provided are four sets of the optocoupler detection module; a first set of the optocoupler detection module comprises a current limiting resistor (R24), a Metal-Oxide-Semiconductor (MOS) tube (Q5), a resistor (R74), an optocoupler (U3), a resistor (R75), a resistor (R76), and a resistor (R33), a PGO interface of the PoE-PD interface controller (U11) is connected to a positive output end of the rectifier module via the resistor (R24), a gate of the MOS tube (Q5) is connected to the PGO interface of the PoE-PD interface controller (U11), a source of the MOS tube (Q5) is grounded, a drain of the MOS tube (Q5) is connected to the positive output end of the rectifier module via a light-emitting diode of the optocoupler (U3), the resistor (R76), and the resistor (R75) sequentially connected in series, the drain of the MOS tube (Q5) is connected to the positive output end of the rectifier module via the resistor (R74), an emitter of a photosensitive triode of the optocoupler (U3) is grounded, and a collector of the photosensitive triode of the optocoupler (U3) is connected to a common Input/Output (I/O) port of the central control module;

a second set of the optocoupler detection module comprises an optocoupler (U4), a resistor (R18), a resistor (R19), and a resistor (R32), an NCL interface of the PoE-PD interface controller (U11) is connected to the positive output end of the rectifier module via a light-emitting diode of the optocoupler (U4), the resistor (R19), the resistor (R18) sequentially connected in series, an emitter of a photosensitive triode of the optocoupler (U4) is grounded, a collector of the photosensitive triode of the optocoupler (U4) is connected to a 3.3V power supply via the resistor (R32), and the collector of the photosensitive triode of the optocoupler (U4) is connected to a common I/O port of the central control module;

a third set of the optocoupler detection module comprises an optocoupler (U7), a resistor (R21), a resistor (R20), and a resistor (R35), an NCM interface of the PoE-PD interface controller (U11) is connected to the positive output end of the rectifier module via a light-emitting diode of the optocoupler (U7), the resistor (R21), and the resistor (R20) sequentially connected in series, an emitter of a photosensitive triode of the optocoupler (U7) is grounded, a collector of the photosensitive triode of the optocoupler (U7) is connected to a 3.3V power supply via the resistor (R35), and the collector of the photosensitive triode of the optocoupler (U7) is connected to a common I/O port of the central control module; and a fourth set of optocoupler detection module comprises an optocoupler (U8), a resistor (R23), a resistor (R22), and a resistor (R38), an LCF interface of the PoE-PD interface controller (U11) is connected to the positive output end of the rectifier module via a light-emitting diode of the optocoupler (U8), the resistor (R23), and the resistor (R22) sequentially connected in series, an emitter of a photosensitive triode of the optocoupler (U8) is grounded, a collector of the photosensitive triode of the optocoupler (U8) is connected to a 3.3V power supply via the resistor (R38), and the collector of the photosensitive triode of the optocoupler (U8) is connected to a common I/O port of the central control module.

6. The new POE & cable tester with BT standard test according to claim 5, wherein a filter capacitor (C22) is connected between the positive output end of the rectifier module and ground.

7. The new POE & cable tester with BT standard test according to claim 1, wherein a Transient Voltage Suppression (TVS) tube (D9) is connected between a gate of the MOS tube (Q5) and ground.

* * * * *